(12) United States Patent
Hirayanagi

(10) Patent No.: US 6,835,511 B2
(45) Date of Patent: Dec. 28, 2004

(54) METHODS AND APPARATUS FOR DETECTING AND CORRECTING RETICLE DEFORMATIONS IN MICROLITHOGRAPHY

(75) Inventor: Noriyuki Hirayanagi, Tokyo (JP)

(73) Assignee: Nikon Corporation, Tokyo (JP)

( * ) Notice: Subject to any disclaimer, the term of this patent is extended or adjusted under 35 U.S.C. 154(b) by 125 days.

(21) Appl. No.: 10/132,343

(22) Filed: Apr. 24, 2002

(65) Prior Publication Data

US 2002/0192598 A1 Dec. 19, 2002

(30) Foreign Application Priority Data

Apr. 24, 2001 (JP) ........................................ 2001-125563

(51) Int. Cl.$^7$ ................................................. G03C 5/00
(52) U.S. Cl. .......................... 430/22; 430/30; 430/296; 430/942; 250/491.1; 250/492.1; 250/492.2; 250/492.22; 250/492.3
(58) Field of Search ........................... 430/22, 30, 296, 430/942; 250/491.1, 492.1, 492.2, 492.22, 492.3

(56) References Cited

U.S. PATENT DOCUMENTS 6,277,532 B1 * 8/2001 Yahiro .......................... 430/30

* cited by examiner

Primary Examiner—Christopher G. Young
(74) Attorney, Agent, or Firm—Klarquist Sparkman, LLP

(57) ABSTRACT

Microlithography methods and apparatus are disclosed that allow reticle deformations to be measured and corrected quickly and accurately. Multiple alignment marks (comprising a "first set" and "second set" of reticle-position-measurement marks) are formed on the reticle. A first set of reticle-deformation data is obtained by detecting the positions of at least some of the first set of reticle-position-measurement marks using an inspection device that is separate from the microlithography apparatus with which the reticle will be used for making lithographic exposures. The first set of reticle-deformation data is stored in a first memory. The reticle then is mounted in the microlithography apparatus, in which a second set of reticle-deformation data is obtained by detecting the positions of at least some of the second set of reticle-position-measurement marks. The second set of reticle-deformation data is stored in a second memory. Lithographic exposures are performed, using the reticle so measured, while correcting the respective positions and/or deformations of the respective subfields on the fly, according to both sets of reticle-deformation data recalled from the respective memories.

36 Claims, 11 Drawing Sheets

METHODS AND APPARATUS FOR DETECTING AND CORRECTING RETICLE DEFORMATIONS IN MICROLITHOGRAPHY

FIELD

This disclosure pertains to microlithography (transfer of a pattern to a sensitive substrate), especially as performed using a charged particle beam. Microlithography is a key technology used in the fabrication of microelectronic devices such as integrated circuits, displays, and micromachines. More specifically, the disclosure pertains, inter alia, to charged-particle-beam (CPB) microlithography performed using a pattern-defining segmented reticle on which the pattern is divided into multiple subfields each defining a respective portion of the pattern, and to methods by which distortion of projected subfield images, as caused by reticle deformation, is corrected quickly, inexpensively, and with high accuracy.

BACKGROUND

Conventional methods and apparatus are described below in the context of using an electron beam as a representative charged particle beam.

With the relentless drive to progressively smaller feature sizes (now less than 0.10 $\mu$m) the pattern-resolution limitations of optical microlithography have become a major limitation. To solve this problem, considerable effort currently is being expended to develop a practical "next generation" microlithography technology. A major effort to such end involves using a charged particle beam (e.g., an electron beam) as the lithographic energy beam. Charged-particle-beam (CPB) microlithography is expected to produce substantially better pattern resolution for reasons similar to the reasons for which electron microscopy yields better image resolution than optical microscopy.

Current CPB microlithography technology does not yet embody a solution to the problem of projecting an entire pattern in one shot from the reticle to the substrate. Consequently, according to one conventional method, the pattern is divided into individual exposure units usually termed "subfields" each defining a respective portion of the overall pattern. The subfields are defined on a "segmented" reticle and exposed in a prescribed order subfield-by-subfield. This exposure scheme is termed "divided-reticle pattern transfer," as described for example in U.S. Pat. No. 5,260,151 and Japan Kôkai (published) Patent Document No. Hei 8-186070. As can be surmised, the optical field of CPB optics required to transfer a single subfield is much smaller than otherwise would be required to transfer the entire pattern in one shot. During transfer of each subfield, the respective subfield image is formed on the substrate in a manner such that, when exposure is complete, the subfield images are "stitched" together in a manner by which they collectively form the entire contiguous pattern on the substrate.

The subfields typically are arrayed on the reticle in rows and columns, wherein each row has a length substantially equal to the diameter of the optical field of the CPB optical system. During exposure of a row of subfields, the charged particle beam is deflected laterally as required to transfer the subfields in the row in sequential order. In progressing from one row to the next, the reticle and substrate typically are scanned mechanically in opposite lateral directions.

From the foregoing, it will be understood that conventional divided-reticle pattern transfer exhibits substantially lower "throughput" (number of wafer substrates that can be processed lithographically per unit time) than optical microlithography in which an entire die can be exposed in one shot.

Two types of reticles generally are used in divided-reticle pattern transfer. The first type is termed a "scattering-stencil" reticle, and the second type is termed a "scattering-membrane" reticle. In a scattering-stencil reticle, pattern elements are defined by respective apertures (through-holes) in a "CPB-scattering" membrane (usually of silicon) having a thickness of approximately 1 to 5 $\mu$m. In a scattering-membrane reticle, pattern elements are defined by a corresponding patterned layer of a highly CPB-scattering material formed on a thin, relatively non-scattering membrane.

Both types of reticles summarized above are produced by first fabricating a suitable "reticle blank" (typically made from a silicon wafer) including a reticle membrane, and then forming the pattern on or in the membrane. The pattern normally is formed by electron-beam drawing followed by etching of the membrane to form a scattering-stencil reticle or of the layer of highly scattering material to form a scattering-membrane reticle. Forming the elements of the pattern in this manner on the reticle membrane can result in distortion and deformation of the respective pattern portions as defined in the subfields. Distortion and deformation also may arise when the reticle is mounted on a reticle stage of the CPB microlithography apparatus by electrostatic chucking or the like. Whenever a lithographic exposure is performed with a deformed reticle, the pattern image as projected from the reticle onto a lithographic substrate exhibits a corresponding deformation, which degrades the accuracy of pattern transfer (especially manifest as overlay errors or stitching errors). Accordingly, minimizing reticle deformation is important from the standpoint of obtaining the best possible pattern-transfer accuracy.

Methods have been proposed for measuring reticle deformation before using the reticle for microlithography. Subsequent lithographic exposure using the reticle is performed while correspondingly correcting the deformation. Corrections are made by, for example, adjusting the projection-optical system of the microlithography apparatus to make appropriate changes to image magnification, rotation, and position. The adjustments are made based on the measurement data obtained prior to commencing lithography.

In one conventional method, measurement marks are defined on the support struts of the reticle between the subfields. Before using the reticle for lithographic exposures, relative positions of the measurement marks are determined using an inspection device such as a coordinate-measurement device. Detected positional anomalies indicating reticle deformation are corrected.

In another conventional method, measurement marks are defined on the membrane portions of individual subfields of the reticle, as disclosed in Japan Kôkai Patent Document Nos. Hei 11-30850, 11-142121, and 2000-124114. The marks are illuminated using an electron beam of the microlithography apparatus. The relative positions or dimensions of the marks are measured, and positional or dimensional anomalies indicating reticle deformation are corrected.

In actual practice there are many diverse causes of reticle deformation. As a result, sufficient correction of reticle deformation usually cannot be obtained using the conventional corrective schemes summarized above. Also, the conventional deformation-correction methods summarized above require long reticle-inspection times in order to ascertain positional errors in all the subfields of the reticle.

SUMMARY

In view of the shortcomings of conventional methods as summarized above, the present invention provides, inter alia, lithographic-exposure methods in which reticle deformation is measured substantially more rapidly, more inexpensively, and with greater accuracy than conventionally.

A first aspect of the invention is set forth in the context of a microlithography method, performed using a microlithography apparatus, in which a device pattern to be transferred onto a sensitive substrate is defined on a reticle that is divided into multiple subfields each defining a respective portion of the pattern. The reticle is illuminated subfield-by-subfield with an illumination beam to produce a corresponding patterned beam carrying an aerial image of the illuminated region of the reticle. The aerial image carried by the patterned beam is projected and focused as a subfield image at a respective location on the sensitive substrate, and the subfield images on the substrate are stitched together to form the device pattern on the substrate. More specifically, in the context of such a microlithography method, a first aspect of the invention is directed to methods for correcting deformation of the reticle. In an embodiment of such a method, multiple position-measurement marks are defined on the reticle. Using a reticle-inspection device separate from the microlithography apparatus with which the reticle is to be used for making lithographic exposure, respective positional coordinates of at least some of the position-measurement marks on the reticle are detected so as to produce a first set of reticle-deformation data. The reticle is then mounted in the microlithography apparatus, and respective positional coordinates of at least some of the position-measurement marks on the reticle are detected so as to produce a second set of reticle-deformation data. While performing exposure of the pattern from the reticle to the substrate, one or more of the position and distortion of each subfield is corrected according to both the first and second sets of reticle-deformation data.

In such methods, exposure of the pattern can be performed using a charged-particle illumination beam and a charged-particle patterned beam.

Further with respect to these methods, the first set of reticle-deformation data can comprise a respective linear component and a respective non-linear component. In such an instance the second set of reticle-deformation data desirably comprises a respective linear component and a respective non-linear component, and one or more of the position and distortion of each subfield desirably is corrected according to the non-linear component of the first set of reticle-deformation data and the linear component of the second set of reticle-deformation data. These methods further can comprise the step of, for each subfield, calculating data regarding a respective rotational error and data regarding a respective orthogonality error from the first set of reticle-deformation data. For each subfield, data regarding a respective magnification error are calculated from the second set of reticle-deformation data. While performing exposure, one or more of the position and distortion of each subfield is corrected according to at least some of the respective calculated rotational error, orthogonality error, and magnification error.

In any of these methods, multiple reticles can be produced using an identical manufacturing process for all the reticles. In such an instance the first and second sets of reticle-deformation data can be obtained from one of the multiple reticles. The first and second sets of reticle-deformation data can be used to correct, when using another of the multiple reticles for making a lithographic exposure, one or more of the position and distortion of each subfield.

Other methods according to the invention are set forth in the context of a microlithography method, performed using a microlithography apparatus, in which a pattern is defined by a reticle segmented into subfields each defining a respective portion of the pattern, wherein the methods pertain to correcting deformation of the reticle. In an embodiment, first and second sets of position-measurement marks are defined on the reticle. Respective coordinates of the first set of position-measurement marks are obtained to provide a first set of deformation data. From the first set of deformation data, linear-correction parameters of the first set of deformation data are calculated. Linear components of the first set of deformation data are obtained, and non-linear components of the first set of deformation data are calculated. Respective coordinates of the second set of position-measurement marks are measured to provide a second set of deformation data. From the second set of deformation data, linear-correction parameters of the second set of deformation data are calculated. Linear components of the second set of deformation data are obtained, and subfield-position-coordinate data are obtained for the second set of deformation data. The subfield-position-coordinate data of second set of deformation data are entered into a subfield-position-coordinate table. Respective linear distortions of the subfields of the reticle are calculated from subfield-coordinate-measurement data obtained from the second set of position-measurement marks. Respective non-linear distortions of the subfields of the reticle are calculated from the non-linear components of the first set of deformation data. The calculated linear and non-linear distortion data are entered into the subfield-position-coordinate table, and exposure of the subfields of the reticle is performed based on corresponding recalled data from the subfield-position-coordinate table.

In the foregoing method the position-measurement marks of the first set desirably are located on support struts, and the position-measurement marks of the second set desirably are located in peripheral subfields of the reticle. The respective coordinates of the first set of position-measurement marks desirably are measured using a coordinate-measuring device that is separate from the microlithography apparatus with which the reticle will be used for making lithographic exposures. The linear-correction parameters of the first set of deformation data desirably are calculated by substituting the first set of deformation data into a matrix-conversion model and performing a least-squares fit, thereby yielding "first linear-correction parameters." The conversion model desirably is a matrix equation in which rotational error ($\theta$), orthogonality error ($\omega$), magnification errors ($S_x$ and $S_y$), and shifts ($O_x$ and $O_y$) of respective center positions of the subfields are respective variables. The linear components of the first set of deformation data desirably are obtained by substituting corresponding design-mandated data into a conversion model into which the linear correction parameters of the first set of deformation data have been substituted. The non-linear components of the first set of deformation data desirably are calculated by subtracting the respective linear components from the first set of deformation data. The respective coordinates of the second set of position-measurement marks desirably are measured using the microlithography apparatus with which the reticle is to be used for making a microlithographic exposure (desirably using a through-the-reticle detection system of the microlithography apparatus). The linear-correction parameters of the second set of deformation data desirably are calculated by substituting the second set of deformation data into a matrix-conversion model and performing a least-squares fit, thereby yielding "second linear-correction parameters." The linear components of subfield distortion desirably are obtained by substituting corresponding design-mandated data into a matrix-conversion model into which the linear-correction parameters of the second set of deformation data have been substituted. Similarly, the subfield-position-coordinate data desirably are obtained by substituting non-linear components of the first set of deformation data into a conversion model into which the second linear-correction parameters have been substituted. The converted non-linear components of the first set of deformation data and the subfield-position-coordinate data of second set of deformation data desirably are entered into a subfield-position-coordinate table in a memory of a controller of a microlithography apparatus with which the reticle is to be used for making a lithographic exposure.

Alternatively, the non-linear components of the first set of deformation data can be regarded as non-linear components of subfield distortion as measured in the microlithography apparatus, without conversion.

In the foregoing method embodiment, the linear distortions of subfields of the reticle, as calculated from subfield-coordinate-measurement data obtained from the first set of position-measurement marks, desirably include rotational error and orthogonality error of the subfields. The non-linear distortions of subfields of the reticle, as calculated from subfield-coordinate-measurement data obtained from the second set of measurement marks, desirably include magnification error of the subfields. The calculated linear and non-linear distortion data desirably are entered into a subfield-position-coordinate table in a memory in a controller of a microlithography apparatus with which the reticle is to be used for making a lithographic exposure.

In view of the foregoing, deformation of a reticle as used in a microlithography apparatus can be estimated as a sum of the linear component of reticle deformation (as measured in the microlithography apparatus) and a modified non-linear component of reticle deformation (as measured outside the microlithography apparatus). Data concerning reticle deformation are obtained by measuring respective coordinates of displacement marks on the reticle. To obtain the linear components of the data, respective mark coordinates are linearly transformed using a 2×2 matrix having, for each mark, four matrix elements and two scalar shifts determined by a least-squares method fitted to the measured reticle-deformation data obtained inside and outside the microlithography apparatus. To obtain the non-linear components of reticle-deformation data obtained outside the microlithography apparatus, the respective linear components simply are subtracted from the measurement data. After obtaining the estimated reticle-deformation data (i.e., data concerning respective coordinate displacements for each mark that is measured), the corresponding distortion and/or coordinate shift for each subfield is calculated taking mark displacement around the subfields (by each matrix and scalar shift) to fit each subfield. Each matrix is converted to respective rotational error, orthogonality error, and magnification error.

Another aspect of the invention is directed to microlithography apparatus. An embodiment of such an apparatus comprises a reticle stage on which a reticle is mounted for making a lithographic exposure of a pattern, defined on the reticle, from the reticle to a sensitive substrate. (The reticle is segmented into multiple subfields each defining a respective portion of the pattern.) The apparatus includes an illumination-optical system situated upstream of the reticle stage and configured for illuminating each of the subfields on the reticle with an illumination beam. The apparatus also includes a projection-optical system situated downstream of the reticle stage and configured for projecting and focusing a patterned beam, formed by passage of the illumination beam through or from an illuminated subfield of the reticle, at a selected location on a surface of the sensitive substrate. The apparatus also includes a substrate stage situated downstream of the projection-optical system and configured for holding the sensitive substrate while a lithographic exposure is being made. The apparatus also includes means for detecting deformation of the reticle mounted to the reticle stage. The apparatus also includes a controller connected to and configured for controlling operation of the reticle stage, the illumination-optical system, the projection-optical system, the substrate stage, and said means for detecting reticle deformation, so as to achieve lithographic transfer of the pattern from the subfields of the reticle to corresponding locations on the sensitive substrate. The controller desirably comprises a first memory configured for storing a first set of reticle-deformation data detected using a reticle-inspection device separate from the microlithography apparatus, a second memory configured for storing a second set of reticle-deformation data detected by the microlithography apparatus, and a correction calculator configured for calculating a position and/or deformation of each subfield as required from the first and second sets of reticle-deformation data recalled from the first and second memories, respectively, and for calculating respective corrections to be applied as each subfield is being exposed lithographically.

The correction calculator further can comprise an exposure-position calculator configured to recall data from the first and second memories, and to calculate, based on the recalled data, respective corrections of exposure position required at various locations on the reticle. The correction calculator further can comprise a third memory for storing a subfield-coordinate-position table in which data produced by the exposure-position calculator are stored. The correction calculator further can comprise a command generator configured to recall data from the subfield-coordinate-position table and issue appropriate control commands to the projection-optical system based on the recalled data.

The highest correction accuracy can be obtained by measuring the coordinates of respective marks distributed on the surface of the reticle so that current deformation data for the reticle can be obtained, and by correcting the respective positions or dimensions of each subfield on the basis of this data. In conventional methods, measurement of the respective coordinates of the marks on the reticle using the microlithography apparatus requires substantial time, which can adversely affect the throughput of the microlithography apparatus. According to various methods as summarized above, measurement time inside the microlithography apparatus is shortened by obtaining certain measurements of the respective coordinates of respective marks using an inspection device separate from the microlithography apparatus, and measuring the coordinates of only some of the marks on the reticle using the microlithography apparatus, thereby avoiding decreases in throughput. Also, since the respective position of each subfield is corrected using deformation data obtained by the separate inspection device and deformation data obtained by the microlithography apparatus, reticle deformation is corrected with high accuracy.

Further with respect to the foregoing methods, it is desirable that the first set of deformation data be divided into a respective linear component and a respective non-linear component. Similarly, it is desirable that the second set of deformation data be divided into a respective linear component and a respective non-linear component. Exposures are performed while the position and/or deformation of each subfield are corrected using the non-linear component of the first set of deformation data and the linear component of the second set of deformation data 2.

Also, since exposure corrections are performed on the basis of deformation data obtained by the separate inspection device and deformation data obtained by the microlithography apparatus, reticle deformation is corrected quickly and with high accuracy.

Situations can arise in which the thermal environment is different in the separate inspection device and in the microlithography apparatus. Accordingly, taking thermal expansion of the reticle and other factors into account, exposure-correction accuracy and precision are improved by measuring parameters such as magnification errors inside the microlithography apparatus. Double corrections are avoided by measuring linear components of deformation inside the microlithography apparatus and non-linear components of deformation using the separate inspection device.

If multiple reticles are manufactured using the same manufacturing process, then reticle-deformation data can be obtained from a single reticle among the multiple reticles. Deformation data from the one reticle can be used for correcting exposure performed with other reticles made by the same process. Because reticles manufactured by the same manufacturing process exhibit reproducibility with respect to reticle deformation, reticle inspection time can be shortened and inspection costs reduced by inspecting only one reticle among the multiple reticles, and using the obtained correction data for correcting exposure using the other reticles.

The foregoing and additional features and advantages of the invention will be more readily apparent from the following detailed description, which proceeds with reference to the accompanying drawings.

BRIEF DESCRIPTION OF THE DRAWINGS

FIGS. 5(A)–5(C) depict respective types of error that can occur in a reticle, wherein FIG. 5(A) depicts rotational error, FIG. 5(B) depicts orthogonality error, and FIG. 5(C) depicts magnification error.

DETAILED DESCRIPTION

The invention is described below in the context of representative embodiments that are not intended to be limiting in any way. Also, certain aspects of the invention are described in connection with using an electron beam as an exemplary charged particle beam. It will be understood that the general principles described herein are applicable with equal facility to use of another type of charged particle beam, such as an ion beam, and to use of other lithographic-energy beams such as ultraviolet light or X-rays.

Figure 2:
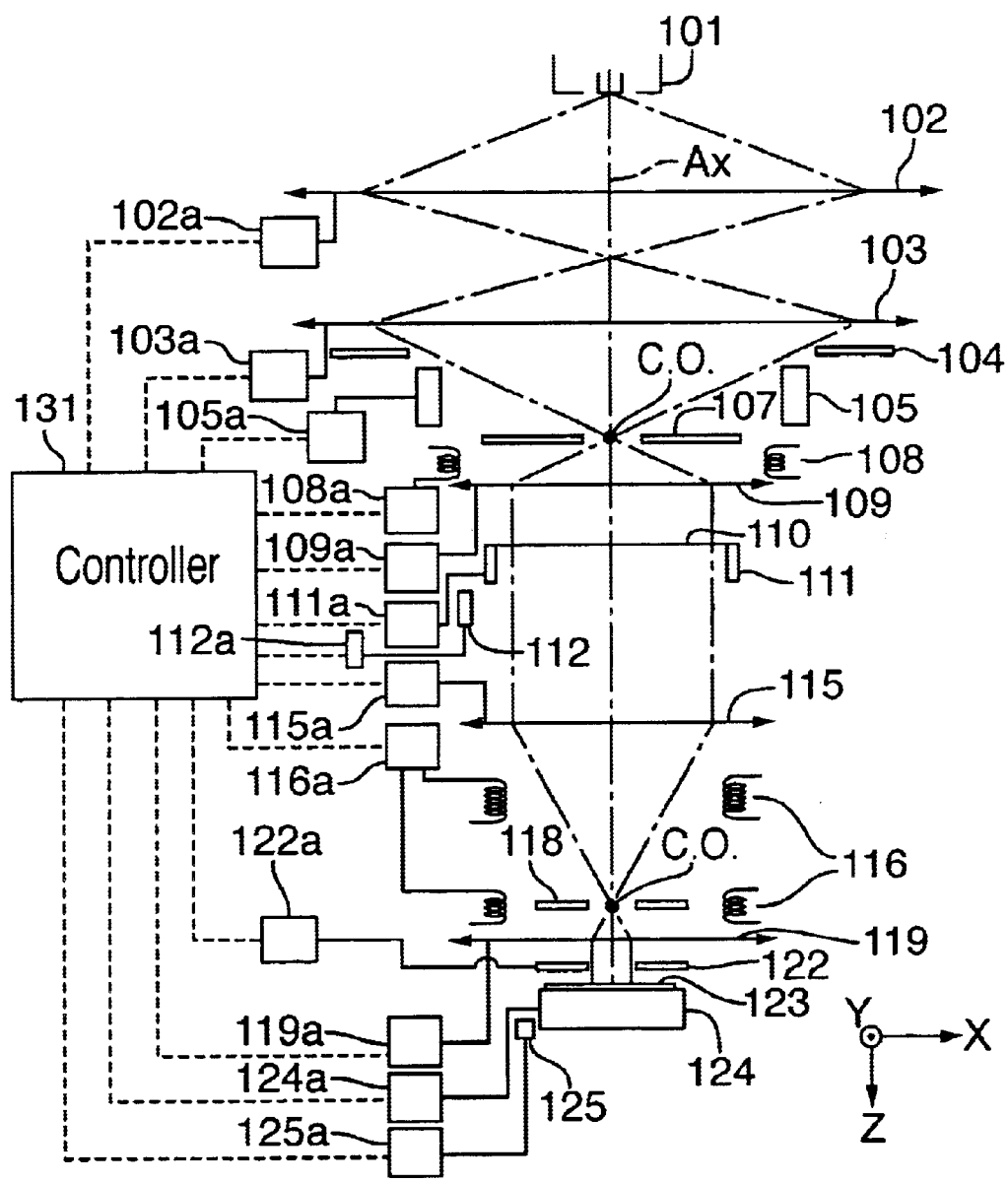
FIG. 2 is an elevational schematic diagram of imaging and control relationships of an electron-beam microlithography apparatus that can be used when performing methods according to the invention.

First, a general description of an electron-beam projection-exposure (microlithography) apparatus and method, employing a divided reticle, is provided below, referring to FIG. 2. FIG. 2 also depicts general imaging and control relationships of the subject system.

Situated at the extreme upstream end of the system is an electron gun 101 that emits an electron beam propagating in a downstream direction generally along an optical axis Ax. Downstream of the electron gun 101 are a first condenser lens 102 and a second condenser lens 103 collectively constituting a two-stage condenser-lens assembly. The condenser lenses 102, 103 converge the electron beam at a crossover C.O. situated on the optical axis Ax at a blanking diaphragm 107.

Downstream of the second condenser lens 103 is a "beam-shaping diaphragm" 104 comprising a plate defining an axial aperture (typically rectangular in profile) that trims and shapes the electron beam passing through the aperture. The aperture is sized and configured to trim the electron beam sufficiently to illuminate one exposure unit (subfield) on the reticle 110. An image of the beam-shaping diaphragm 104 is formed on the reticle 110 by an illumination lens 109.

The electron-optical components situated between the electron gun 101 and the reticle 110 collectively constitute an "illumination-optical system" of the depicted microlithography system. The electron beam propagating through the illumination-optical system is termed an "illumination beam" because it illuminates a desired region of the reticle 110. As the illumination beam propagates through the illumination-optical system, the beam actually travels in a downstream direction through an axially aligned "beam tube" (not shown but well understood in the art) that can be evacuated to a desired vacuum level.

A blanking deflector 105 is situated downstream of the beam-shaping aperture 104. The blanking deflector 105 laterally deflects the illumination beam as required to cause the illumination beam to strike the aperture plate of the blanking diaphragm 107, thereby preventing the illumination beam from being incident on the reticle 110 during blanking.

A subfield-selection deflector 108 is situated downstream of the blanking diaphragm 107. The subfield-selection deflector 108 laterally deflects the illumination beam as required to illuminate a desired reticle subfield situated within the optical field of the illumination-optical system. Thus, subfields of the reticle 110 are scanned sequentially by the illumination beam in a horizontal direction (X direction in the figure). The illumination lens 109 is situated downstream of the subfield-selection deflector 108.

The reticle 110 extends in a plane (X-Y plane) that is perpendicular to the optical axis Ax. The reticle 110 typically defines many subfields (e.g., thousands of subfields). The subfields collectively define the pattern for a layer to be formed at a single die ("chip") on a lithographic substrate, wherein each subfield defines a respective portion of the pattern. (The subfields collectively defining an entire pattern can be located on a single reticle or divided between multiple reticles.)

The reticle 110 is mounted on a movable reticle stage 111. Using the reticle stage 111, by moving the reticle 110 in a direction (Y and/or X direction) perpendicular to the optical axis Ax, it is possible to illuminate the respective subfields on the reticle 110 extending over a range that is wider than the optical field of the illumination-optical system. The position of the reticle stage 111 in the XY plane is determined using a "position detector" 112 typically configured as a laser interferometer. A laser interferometer is capable of measuring the position of the reticle stage 111 with extremely high accuracy in real time.

Situated downstream of the reticle 110 are first and second projection lenses 115, 119, respectively, and an imaging-position deflector 116. The illumination beam, by passage through an illuminated subfield of the reticle 110, becomes a "patterned beam" because the beam carries an aerial image of the illuminated subfield. The patterned beam is imaged at a specified location on a substrate 123 (e.g., "wafer") by the projection lenses 115, 119 collectively functioning as a "projection-lens assembly." To ensure imaging at the proper location, the imaging-position deflector 116 imparts the required lateral deflection of the patterned beam.

So as to be imprintable with the image carried by the patterned beam, the upstream-facing surface of the substrate 123 is coated with a suitable "resist" that is imprintably sensitive to exposure by the patterned beam. When forming the image on the substrate, the projection-lens assembly "reduces" (demagnifies) the aerial image. Thus, the image as formed on the substrate 123 is smaller (usually by a defined integer-ratio factor termed the "demagnification factor") than the corresponding region illuminated on the reticle 110. By thus causing imprinting on the surface of the substrate 123, the apparatus of FIG. 2 achieves "transfer" of the pattern image from the reticle 110 to the substrate 123.

The components of the depicted electron-optical system situated between the reticle 110 and the substrate 123 collectively are termed the "projection-optical system." The substrate 123 is situated on a substrate stage 124 situated downstream of the projection-optical system. As the patterned beam propagates through the projection-optical system, the beam actually travels in a downstream direction through an axially aligned "beam tube" (not shown but well understood in the art) that can be evacuated to a desired vacuum level.

The projection-optical system forms a crossover C.O. of the patterned beam on the optical axis Ax at the rear focal plane of the first projection lens 115. The position of the crossover C.O. on the optical axis Ax is a point at which the axial distance between the reticle 110 and substrate 123 is divided according to the demagnification ratio. Situated at the crossover C.O. (i.e., the rear focal plane) is a contrast-aperture diaphragm 118. The contrast-aperture diaphragm 118 comprises an aperture plate that defines an aperture centered on the axis Ax. With the contrast-aperture diaphragm 118, electrons of the patterned beam that were scattered during transmission through the reticle 110 are blocked so as not to reach the substrate 123.

A backscattered-electron (BSE) detector 122 is situated immediately upstream of the substrate 123. The BSE detector 122 is configured to detect and quantify electrons backscattered from certain "marks" situated on the upstream-facing surface of the substrate 123 or on an upstream-facing surface of the substrate stage 124. For example, a mark on the substrate 123 can be scanned by a beam that has passed through a corresponding mark pattern on the reticle 110. By detecting backscattered electrons from the mark at the substrate 123, it is possible to determine the relative positional relationship of the reticle 110 and the substrate 123.

The substrate 123 is mounted to the substrate stage 124 via a wafer chuck (not shown but well understood in the art), which presents the upstream-facing surface of the substrate 123 in an XY plane. The substrate stage 124 (with chuck and substrate 123) is movable in the X and Y directions. Thus, by simultaneously scanning the reticle stage 111 and the substrate stage 124 in mutually opposite directions in a synchronous manner, it is possible to transfer each subfield within the optical field of the illumination-optical system as well as each subfield outside the optical field to corresponding regions on the substrate 123. The substrate stage 124 also includes a "position detector" 125 configured similarly to the position detector 112 of the reticle stage 111.

Each of the lenses 102, 103, 109, 115, 119 and deflectors 105, 108, 116 is controlled by a controller 131 via a respective coil-power controller 102a, 103a, 109a, 115a, 119a and 105a, 108a, 116a. Similarly, the reticle stage 111 and substrate stage 124 are controlled by the controller 131 via respective stage drivers 111a, 124a. The position detectors 112, 125 produce and route respective stage-position signals to the controller 131 via respective interfaces 112a, 125a each including amplifiers, analog-to-digital (A/D) converters, and other circuitry for achieving such ends. In addition, the BSE detector 122 produces and routes signals to the controller 131 via a respective interface 122a.

From the respective data routed to the controller 131, as a subfield is being transferred the controller 131 ascertains, inter alia, any control errors of the respective stage positions. To correct such control errors, the imaging-position deflector 116 is energized appropriately to deflect the patterned beam. Thus, a reduced image of the illuminated subfield on the reticle 110 is transferred accurately to the desired target position on the substrate 123. This real-time correction is made as each respective subfield image is transferred to the substrate 123, and the subfield images are positioned such that they are stitched together properly on the substrate 123.

Figure 3A:
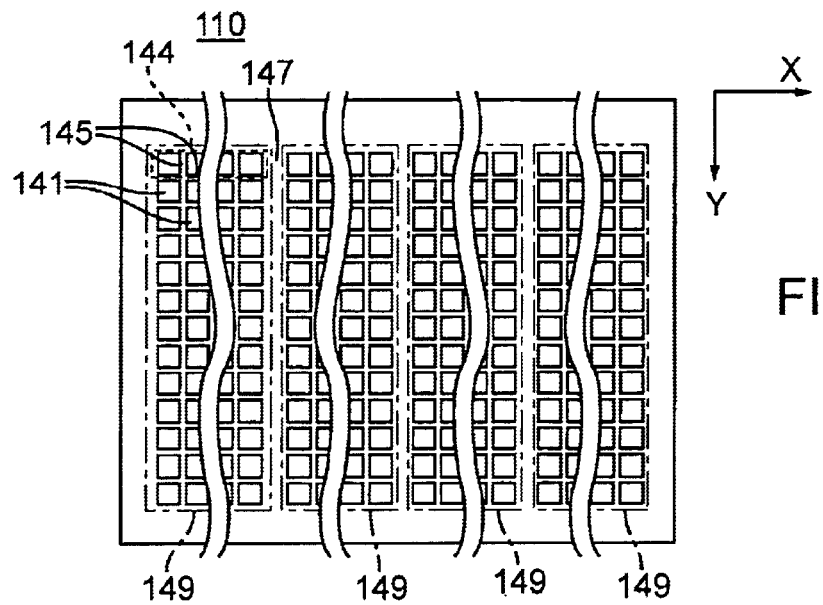
FIG. 3(A) is a plan view showing general aspects of a segmented reticle as used, for example, in the apparatus of FIG. 2.
Figure 3B:
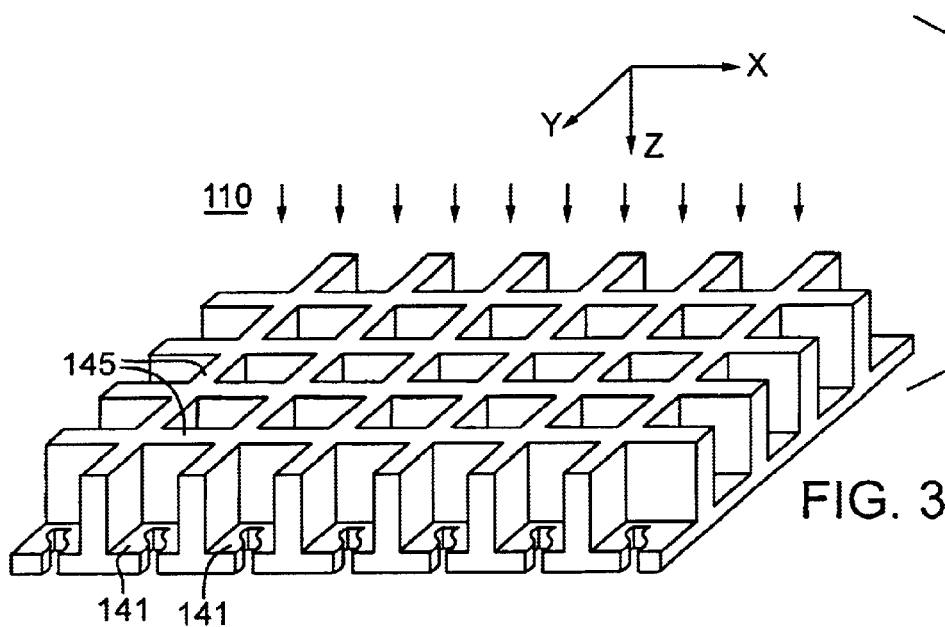
FIG. 3(B) is an oblique view of a portion of the reticle shown in FIG. 3(A).
Figure 3C:
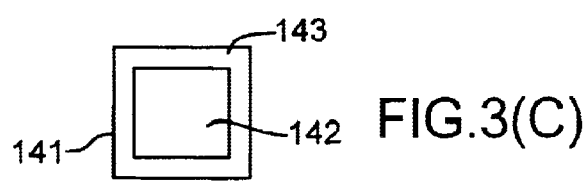
FIG. 3(C) is a plan view of a single subfield of the reticle of FIG. 3(A).

Details of an exemplary divided reticle 110 as used with the system of FIG. 2 are shown in FIGS. 3(A)–3(C). FIG. 3(A) is a plan view, FIG. 3(B) is an oblique view of a portion of the reticle, and FIG. 3(C) is a plan view of a single subfield. The depicted reticle 110 can be manufactured by electron-beam direct writing and etching of a "reticle blank" made from a silicon wafer, for example.

FIG. 3(A) shows the general configuration of the entire reticle 110. In the figure, multiple regions 149 are shown each including a large respective array of subfields 141. The regions 149 generally are termed "stripes," and each stripe 149 extends in the Y direction. Each stripe 149 includes multiple rows 144 of subfields 141, wherein each row 144 extends in the X direction. Each subfield 141 comprises a respective portion of the reticle membrane. Depending somewhat upon the particular type of reticle (scattering-membrane reticle or scattering-stencil reticle), the membrane has a thickness of, e.g., 0.1 µm to several µm. In the depicted configuration, the subfields 141 in each row 144 and the rows 144 in each stripe 149 are separated from each other by respective "minor struts" 145. The stripes 149 are separated from each other by major struts 147.

As shown in FIG. 3(C), each subfield 141 comprises a respective pattern-defining region 142 surrounded by a skirt 143. In a particular subfield 141, the respective pattern-defining region 142 defines the pattern features of the respective portion of the pattern defined by that subfield 141. The skirt 143 is not patterned. During exposure of the particular subfield 141, only the respective pattern-defining region 142 is transferred; the respective skirt 143 is not transferred. The edges of the illumination beam incident on the subfield fall within the respective skirt 143. As discussed above, the reticle 110 can be a scattering-stencil type or a scattering-membrane type. I.e., either type of reticle 110 can be used with the apparatus of FIG. 2, for example.

The currently practicable size of the membrane area 142 of a single subfield 141 is approximately 0.5 to 5 mm square on the reticle 110. At a demagnification ratio of ⅕, for example, the size of the reduced subfield image as projected onto the substrate 123 is approximately 0.1 to 1 mm square.

The minor struts 145 intersect with each other at right angles to form a lattice of "grillage" that strengthens and confers rigidity to the reticle 110. By way of example, the minor struts 145 are each about 0.5 to 1 mm thick (in the Z direction) and about 0.1 mm wide (in the X or Y direction); the skirt 143 is about 0.05 mm wide, for example. The grillage includes the major struts 147 that confer additional rigidity and strength to the reticle 110. The major struts 147 are contiguous with the minor struts 145.

The rows 144 shown in FIG. 3(A) also are known as "electrical stripes" because exposure of each row involves an electrically induced deflection of the illumination and patterned beams using the subfield-selection and imaging-position deflectors 108, 116, respectively. Similarly, the stripes 149 shown in FIG. 3(A) are also known as "mechanical stripes" because exposure of a full stripe 149 involves mechanical movement of the reticle 110 and substrate 123 by the reticle stage 112 and substrate stage 124, respectively. Hence, multiple subfields 141 are arrayed in the X direction in the figure to form each electrical stripe 144, and multiple electrical stripes 144 are arrayed in the Y direction to form each mechanical stripe 149. The length of an electrical stripe 144 (equal to the width of the corresponding mechanical stripe 149) corresponds to the width of the optical field of the illumination-optical system (which corresponds to the width of a range of deflection achievable by the subfield-selection deflector 108).

As an alternative to the reticle configuration shown in FIGS. 3(A)–3(C), a segmented reticle can comprise electrical stripes in which the respective subfields are not separated from each other. In other words, in such an alternative reticle, the constituent subfields of each electrical stripe are contiguous with each other with no intervening minor struts 145 or skirts 143. However, minor struts 145 (and skirts) are still present between adjacent electrical stripes of a mechanical stripe, and major struts 147 are still present between adjacent mechanical stripes. During exposure of this type of segmented reticle, the constituent subfields of an electrical stripe are exposed in a continuous lateral scanning sweep of the illumination beam along each electrical stripe.

According to an effective exposure method, and referring further to the reticle 110 shown in FIG. 3(A), the subfields 141 in a selected electrical stripe 144 within a selected mechanical stripe 149 are illuminated sequentially by appropriate deflections of the illumination beam in the X direction. Successive electrical stripes 144 in the selected mechanical stripe 149 are exposed by continuous scanning motions of the stages 111, 124.

Figure 11:
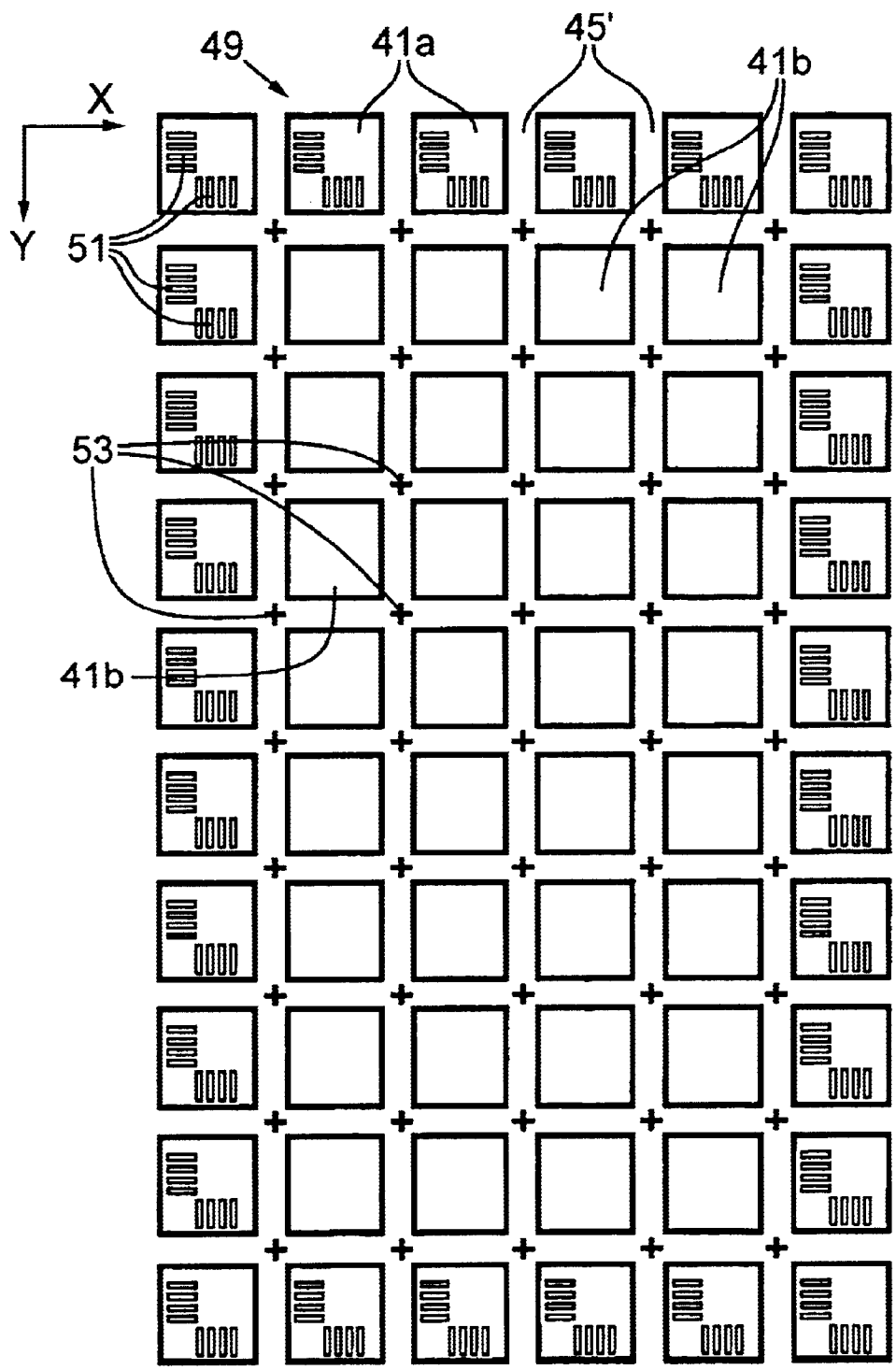
FIG. 11 is a plan view (from downstream) schematically illustrating a mechanical stripe of a reticle and showing an exemplary disposition of position-measurement marks.

The disposition of subfield-position-measurement marks on a reticle according to a representative embodiment is shown in FIG. 11. FIG. 11 is a schematic plan view (as viewed from the substrate side, or downstream-facing side) of one mechanical stripe of the reticle. The depicted mechanical stripe contains an array of individual subfields 41 arranged in plural electrical stripes (horizontal rows in the figure). Each subfield 41 includes a respective portion of the reticle membrane.

Among the various subfields 41 in the mechanical stripe, the subfields 41a situated around the perimeter of the mechanical stripe include a "second" set (see discussion of "first" set below) of respective subfield-position-measurement marks ("alignment marks") 51 intended to be illuminated individually by the illumination beam. The peripheral subfields 41a do not contain any respective elements of the device pattern defined by the reticle; rather, the peripheral subfields 41a contain only respective alignment marks 51. The alignment marks 51 desirably are stencil-type line-and-space patterns each defining multiple band-like openings. Each alignment mark 51 consists of a respective pair of mark-element groups, one group consisting of band-like openings arrayed in the X-direction and the other group consisting of band-like openings arrayed in the Y-direction. Meanwhile, each of the remaining subfields 41b situated inboard of the peripheral subfields 41a define elements of respective portions of the device pattern defined by the reticle. The respective positions of the alignment marks 51 are detected using an electron beam of the microlithography apparatus.

The reticle of FIG. 11 also includes a "first" set of subfield-position-measurement marks ("measurement marks") 53 situated on the downstream-facing edges 45' of the grillage where respective struts intersect each other between adjacent subfields 41. Each of these measurement marks 53 desirably has a cruciform shape with respective extensions in the X- and Y-directions. Each pattern-portion-defining subfield 41b is associated with four respective measurement marks 53 situated adjacent the respective corners of the subfield. Thus, the point of intersection of lines connecting diametrically opposed measurement marks 53 coincides with the center of the respective subfield 41b. The measurement marks 53 arrayed in the longitudinal and lateral directions ideally are arranged at a certain equal interval spacing at respective coordinates on the reticle. The positions of the measurement marks 53 typically are detected using an inspection device that is separate from the microlithography apparatus.

The measurement marks 53 are formed by vacuum-evaporation of Cr or Ta, for example, on the downstream-facing surface of the reticle blank. To obtain very high positional accuracy of the marks 51, 53 relative to each other, the marks 51, 53 desirably are formed at the same time, during the reticle-manufacturing process, by electron-beam drawing, vacuum evaporation, and etching of a reticle substrate.

Figure 4:
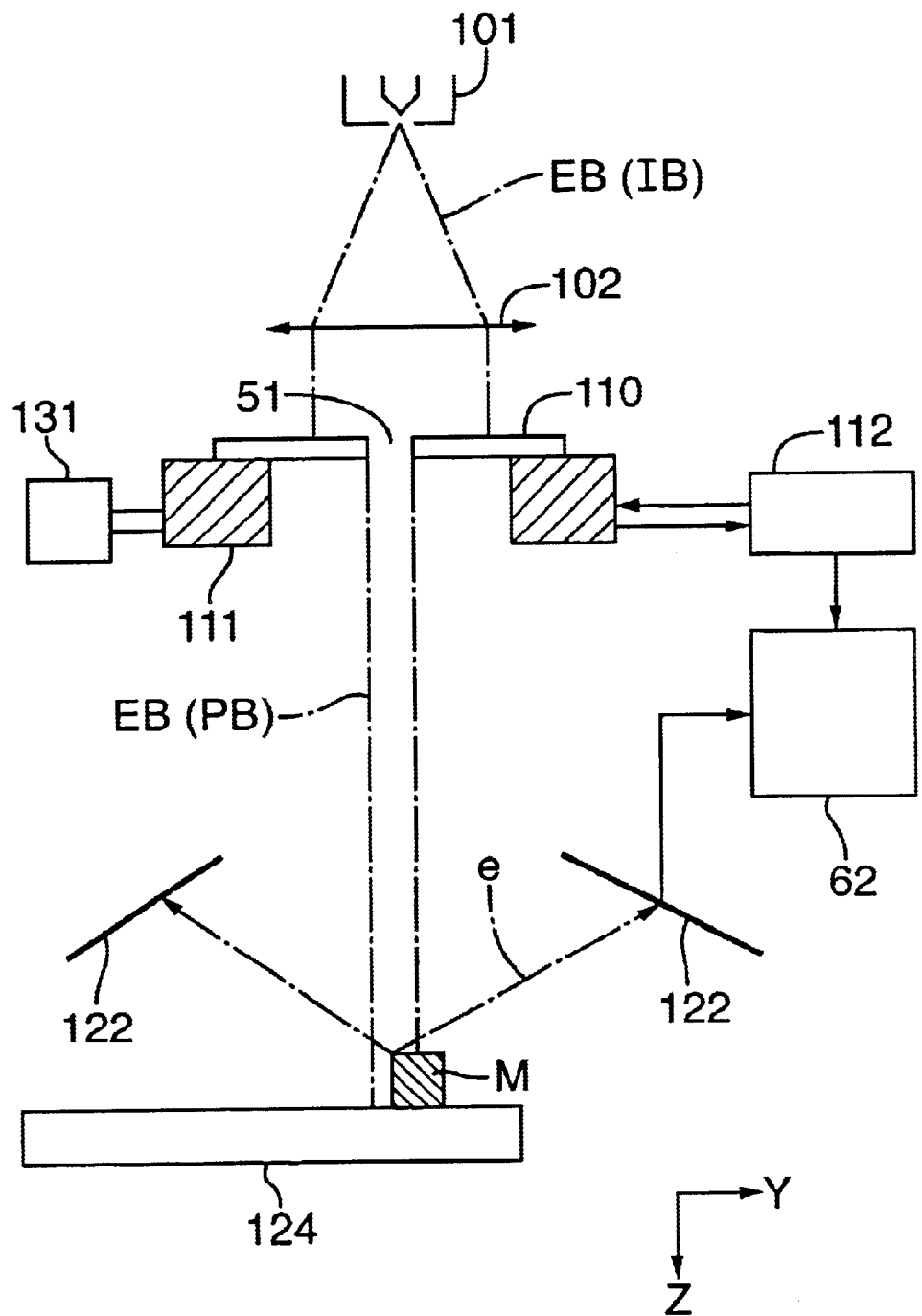
FIG. 4 is an elevational schematic diagram of an embodiment of a method used for detecting the respective coordinates of alignment marks on the reticle.

A representative embodiment of an apparatus and method for detecting alignment marks 51 using the microlithography apparatus is shown in FIG. 4, depicting the electron gun 101, condenser lens 102, reticle 110, and substrate stage 124 of the apparatus shown in FIG. 2. FIG. 4 depicts one band-like opening of an alignment mark 51 situated in a respective subfield of the reticle 110. Specifically, the alignment mark 51 is situated in the membrane region of the respective subfield. One or more reference marks M are defined on the substrate stage 124 and used in conjunction with the alignment marks 51 for position detection. Similar to the alignment marks 51, the reference marks M have a line-and-space configuration, wherein the lines are formed of respective portions of a heavy-metal film and extend in the X-direction and Y-direction. The reticle 110 is mounted on and moved by the reticle stage 111 connected to the controller 131 that controls the overall operation of the microlithography apparatus. The position of the reticle stage 111 is detected using the position detector 112.

The embodiment of FIG. 4 also utilizes the backscattered-electron (BSE) detector 122 situated above the substrate stage 124. By way of example, a total of four BSE detectors 122 can be disposed around the trajectory of the electron beam EB. The BSE detectors 122 detect the quantity of electrons ("e") backscattered in respective directions from the mark M on the substrate stage 124. Data from the BSE detectors 122 are routed to a position calculator 62 configured to calculate the respective coordinates of the alignment marks 51 based on the respective mark-detection data and from corresponding reticle-stage position data from the position detector 112. These data are routed to the position calculator 62 in real time.

More specifically, a subfield 41a containing an alignment mark 51 is illuminated with the electron beam EB (i.e., with the illumination beam IB). The portion of the illumination beam IB passing through the alignment mark 51 is scanned in two dimensions (X and Y) over the corresponding reference mark M on the substrate stage 124. Electrons "e" backscattered from the scanned reference mark M are detected by the BSE detectors 122. BSE data from the BSE detectors 122 and corresponding reticle-stage positional data are used by the position calculator 62 in calculating the actual positional coordinates of the alignment mark 51. The results of this calculation are routed to the controller 131, which calculates the corresponding positional error of the alignment mark 51 from the respective data concerning calculated actual positional coordinates and respective data concerning the design-mandated positional coordinates of the respective alignment mark 51. Overall deformation of the reticle 110 can be determined by performing similar measurements and calculations for the other subfields 41a containing respective alignment marks 51.

Figure 1:
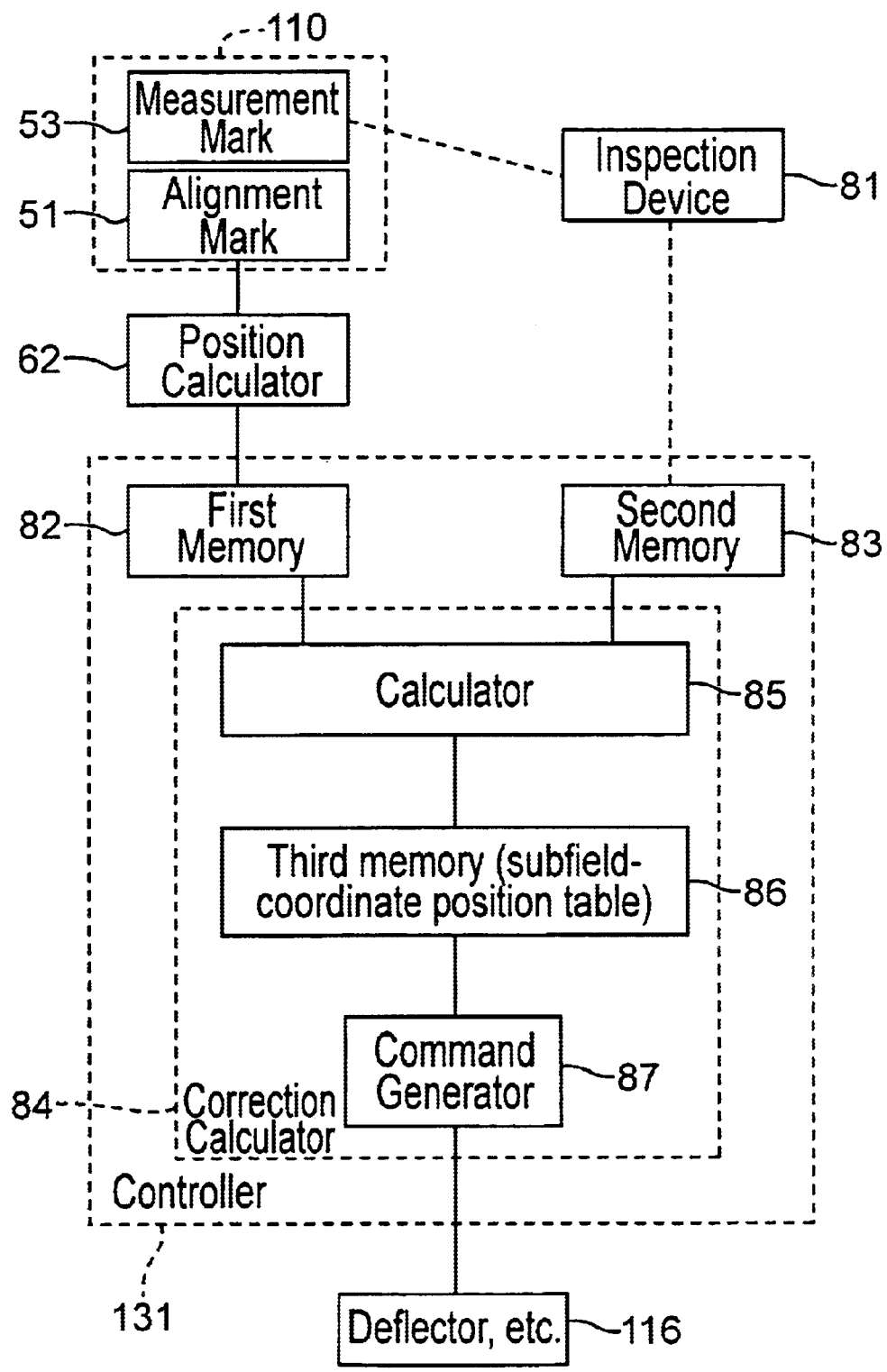
FIG. 1 is a block diagram of the control system of a microlithography apparatus according to a representative embodiment.

A representative embodiment of a control scheme is shown in FIG. 1, depicting a reticle 110 (see FIG. 11) including measurement marks 53 and alignment marks 51 (i.e., first and second sets, respectively, of subfield-position-measurement marks) as described above. The coordinates of the measurement marks 53 are detected using an inspection device 81 that typically is separate from the microlithography apparatus with which the reticle 110 is to be used for making lithographic exposures. As discussed above, the respective coordinates of the alignment marks 51 are determined by the position calculator 62. Data concerning both types of measurements are input to the controller 131. The controller 131 includes a first memory 82 for storing coordinate-positional data from the position calculator 62, and a second memory 83 for storing coordinate-positional data from the inspection device 81. The controller 131 also includes a correction calculator 84 for calculating respective amounts of correction of exposure position required in view of these two sets of positional-coordinate data. More specifically, the correction calculator 84 includes an exposure-position calculator 85 that, based on the positional-coordinate data recalled from the memories 82, 83, calculates the correction of exposure position required at various locations on the reticle. The correction calculator 84 also includes a third memory 86 for storing a subfield-coordinate-position table in which data produced by the exposure-position calculator 85 are stored. The correction calculator 84 also includes a command generator 87 that issues appropriate control commands to the deflector 16 (FIG. 2) based on data recalled from the subfield-coordinate-position table.

Figure 5A:
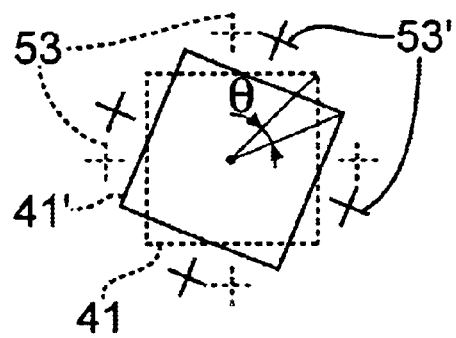
Figure 5B:
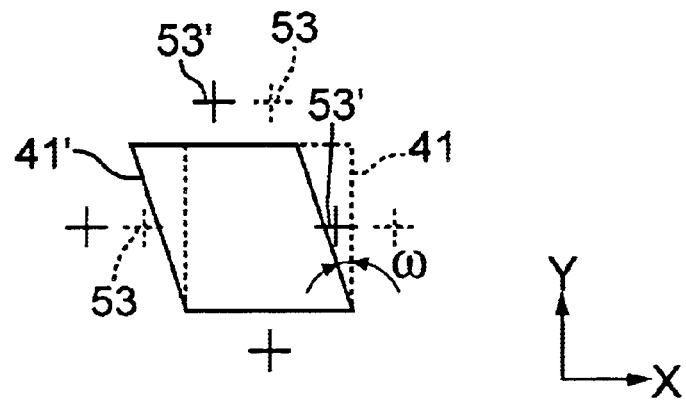
Figure 5C:
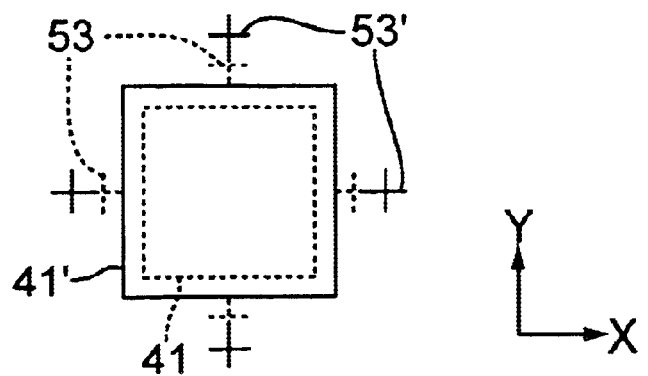

Exemplary types of errors resulting in reticle deformation are shown in FIGS. 5(A)–5(C). FIG. 5(A) depicts a rotational error, FIG. 5(B) depicts an orthogonality error, and FIG. 5(C) depicts a magnification error. In each figure, the respective subfield 41 and measurement marks 53 before occurrence of the respective error are indicated by respective broken lines.

In FIG. 5(A), the subfield 41' and measurement marks 53' as displaced by rotational error are indicated by respective solid lines. In this figure, for example, the subfield 41 has rotated about its center by an angle of θ in the clockwise direction. If the coordinates of a given point inside the subfield 41 are denoted (x, y), then the coordinates of the corresponding point inside the subfield 41' exhibiting rotational error are denoted (xcos θ−ysin θ, xsin θ+ycos θ).

In FIG. 5(B), the subfield 41' and measurement marks 53' as displaced by orthogonality error are indicated by respective solid lines. In this figure, the orthogonality of the subfield 41' is altered (relative to the subfield 41) by an angle ω, causing the subfield 41' to have a parallelogram shape. If the coordinates of a given point inside the subfield 41 are denoted (x, y), then the coordinates of the corresponding point inside the subfield 41' exhibiting orthogonality error are denoted (x−ytan ω, y).

In FIG. 5(C), the subfield 41' and measurement marks 53' as displaced by magnification error are indicated by respective solid lines. In this figure, for example, the reticle has experienced thermal expansion, causing the subfield 41' to be increased in size relative to the corresponding subfield 41. The magnification error in the X-direction is denoted $S_X$, and the magnification error in the Y-direction is designated $S_Y$. If the size of the original subfield 41 is 1×1, then the size of the subfield 41' exhibiting magnification error is $(1+S_X)\times(1+S_Y)$.

In this embodiment, a general coordinate-conversion model is expressed as the following matrix equation that includes the various errors discussed above.

$$\begin{pmatrix} X \\ Y \end{pmatrix} = \begin{pmatrix} 1+S_X & 0 \\ 0 & 1+S_Y \end{pmatrix} \begin{pmatrix} 1 & -\tan\omega \\ 0 & 1 \end{pmatrix} \begin{pmatrix} \cos\theta & -\sin\theta \\ \sin\theta & \cos\theta \end{pmatrix} \begin{pmatrix} x \\ y \end{pmatrix} + \begin{pmatrix} O_X \\ O_Y \end{pmatrix}$$

In the foregoing expression the coordinates before manifestation of the error are denoted (x, y), and the coordinates after manifestation of the error are denoted (X, Y). The terms $O_X$ and $O_Y$ denote the shift in the center position of the respective subfield.

Figure 6:
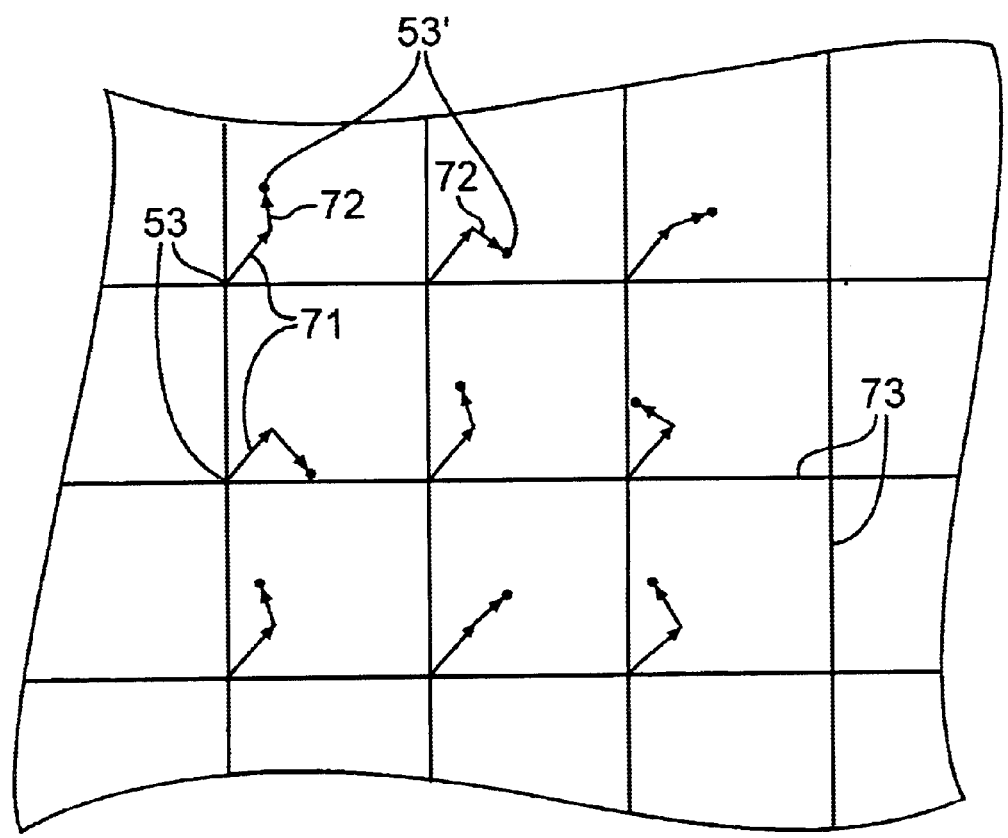
FIG. 6 is a plan-view schematic diagram illustrating exemplary linear components and non-linear components of a reticle deformation.

As can be seen, the positional error imparted to a subfield by reticle deformation includes a respective linear component and a respective non-linear component, such as shown in the example of FIG. 6. FIG. 6 depicts the results of positional measurements of a number of measurement marks 53 as detected using an inspection device separate from the microlithography apparatus. The lattice drawn at a fixed inter-line spacing in FIG. 6 indicates the design-mandated coordinate data for the reticle. The lattice is indicated by center lines 73 of respective support struts, wherein each line 73 extends along the middle of the downstream-facing edge 45' of the respective strut. Whenever no reticle deformation is present, the intersection points of the lines 73 represent the "original" (pre-deformation) coordinates of the respective measurement marks 53, and thus of the subfields.

The black dots in FIG. 6 indicate respective center positions of the detected measurement marks 53'. In FIG. 6, all these center positions are shifted from their respective design-mandated coordinates. Strictly speaking, the magnitude of this shift ("error") is different for each of the points. Note that each error includes a respective linear component 71 having substantially the same orientation and magnitude in each of multiple proximate subfields. Each error also includes a respective non-linear component 72 obtained by subtracting the respective linear component 71 from the respective error. Typically, for each measurement mark 53', the respective non-linear component 72 has a different orientation and magnitude.

Figure 7:
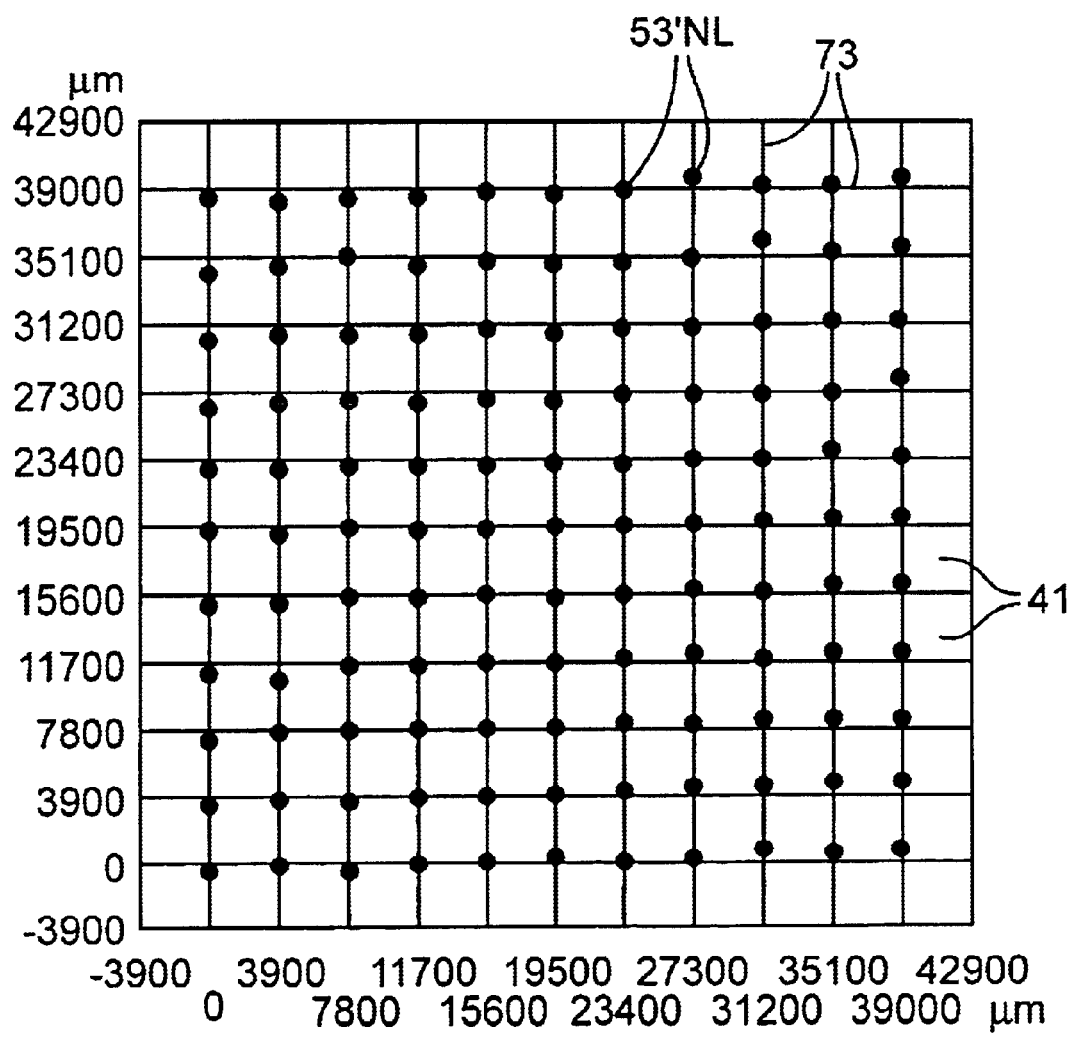
FIG. 7 is a plan-view schematic diagram showing only exemplary non-linear components of a reticle deformation.

FIG. 7 depicts an exemplary set of non-linear components of respective errors as generated in a deformed reticle. In the figure, a portion of a stripe including twelve subfields 41 (each having dimensions of 3900 μm×3900 μm) in the longitudinal and lateral directions (total of 144 subfields depicted) is shown. The center lines 73 of the downstream-facing edges 45' of a grillage are shown, disposed at a fixed pitch between the respective subfields 41. Respective points 53'$_{NL}$ (non-linear components) obtained by subtracting the respective linear components 71 from the respective errors of the detected measurement marks 53' are shown in the vicinity of the intersection points of the center lines 73. As discerned in the figure, the points 53'$_{NL}$ are located randomly in the vicinity of the intersection points of the center lines 73, but are within an acceptable tolerance range.

Figure 8:
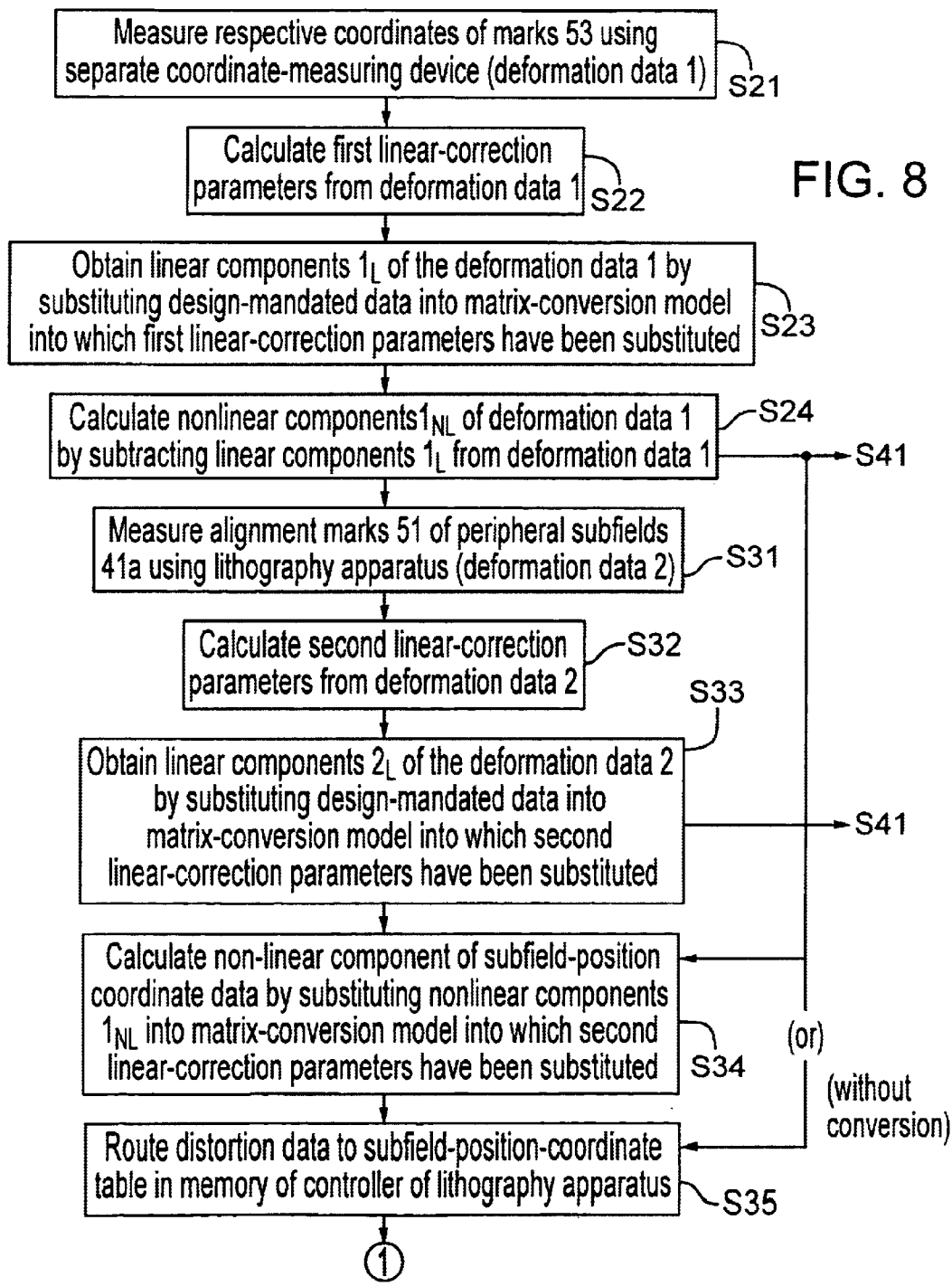
FIG. 8 is a flow chart of a representative embodiment of a method for correcting an arrangement of the subfields resulting from reticle deformation.

In a representative embodiment of a transfer-exposure method, correction of subfield coordinates resulting from deformation of the reticle is shown in FIG. 8. In FIG. 8, after manufacture of the reticle, respective coordinates of the first set of subfield-position-measurement marks (measurement marks) 53 located on the downstream-facing edges 45' of the grillage are measured using a coordinate-measuring device (i.e., the inspection device 81 that is separate from the microlithography apparatus; step S21). Thus, the respective coordinates (constituting a respective "first set" of deformation data, also termed "deformation data 1") of distorted subfields generated by reticle deformation arising typically during manufacture of the reticle (e.g., during reticle-pattern drawing, pattern-working processes, changes in reticle temperature, or reticle stress) are measured. In this measurement, respective errors generated during reticle manufacture (i.e., deformation data 1) are measured for each subfield. For making these measurements, a coordinate-measuring device (e.g., a model XY-6i manufactured by Nikon Corporation, Tokyo, Japan) can be used.

In one example, the deformation data 1 thus obtained for at least some of the subfields are substituted into a matrix-conversion model expressed by the matrix equation above. Thus, the respective coordinates of the marks 53 in the deformation data 1 are linearly transformed by matrix conversion (followed by a least-squares fit) to obtain, for each coordinate, the respective four matrix elements related to the respective parameters θ (rotational error), ω (orthogonality error), and $S_X$ and $S_Y$ (magnification error), as well as the shifts $O_X$ and $O_Y$ of the center position of the respective subfield (step S22).

Next, respective linear components $1_L$ of the deformation data 1 are obtained by substituting corresponding "ideal" (design-mandated) coordinate data for the subfields into the matrix-conversion model into which the first linear-correction parameters have been substituted (step S23). In step S24 respective non-linear components $1_{NL}$ of the deformation data 1 are calculated by subtracting the respective linear components $1_L$ from the deformation data 1.

Next, the reticle is mounted onto the reticle stage of the microlithography apparatus with which the reticle will be used for making lithographic exposures. The respective positional coordinates of the alignment marks 51 (i.e., the second set of subfield-position-measurement marks) disposed in the subfields 41a are detected using a "TTR" (through-the-reticle) detection system as described above (FIG. 4). The resulting respective subfield-coordinate data (i.e., "second set" of deformation data or "deformation data 2") reflect the deformation of the periphery of the stripe and thus of the stripe in general (step S31). This measurement is performed by scanning the reference marks M (FIG. 4) on the substrate stage using an electron beam that has passed through respective alignment marks 51. The reticle deformation indicated by these subfield-coordinate data includes deformation produced by mounting the reticle to the reticle stage. Because these data reflect overall deformation of the stripe, local distortions of each subfield of the stripe need not be (and are not) measured directly.

The deformation data 2 thus obtained are substituted into the matrix-conversion model (see above) to linearly transform the data, followed by a least-squares fit to yield the respective parameters θ (rotational error), ω (orthogonality error), and $S_X$ and $S_Y$ (magnification error), as well as the shifts $O_X$ and $O_Y$ of the center positions of the subfields (step S32). Thus, "second linear-correction parameters" are obtained.

Next, respective linear components $2_L$ of the deformation data 2 are obtained by substituting corresponding "ideal" (design-mandated) coordinate data for the subfields into the matrix-conversion model into which the second linear-correction parameters have been substituted (step S33). In step S34 respective non-linear components of subfield-position coordinates are obtained by substituting respective non-linear components $1_{NL}$ of the previously calculated deformation data 1 into the matrix-conversion model into which the second linear-correction parameters have been substituted (step S34).

Desirably, all measurements of the reticle are performed inside the microlithography apparatus. However, this practice may result in undesirably decreased throughput. As disclosed herein, reticle deformation is separated into two "components." The first component is expressed as a linear function of subfield coordinates, and the other component is expressed as a non-linear function of subfield coordinates. The linear function is comparatively easy to determine with fewer measurements (without having to measure each subfield). Hence, to measure reticle deformation, the linear components are measured inside the microlithography apparatus (yielding the linear components $2_L$), and the non-linear components are obtained from subfield-coordinate measurements performed using a separate inspection device (yielding the non-linear components $1_{NL}$). The linear components desirably are measured inside the microlithography apparatus because the respective thermal environments in the separate inspection device and in the microlithography apparatus may be significantly different. By measuring the parameters of magnification error and the like inside the exposure apparatus, the measurements can be made while taking into account any thermal expansion of the reticle, thereby improving correction accuracy. Also, by obtaining the linear components from coordinate measurements performed inside the microlithography apparatus and obtaining the non-linear components from coordinate measurements performed using the separate inspection device, double corrections are avoided. Thus, high-accuracy position corrections are obtained.

In other words, reticle deformation is a sum of a linear function and a non-linear function of subfield coordinates. Deformation of the reticle as manifest by distortions of subfields of the reticle is measured using the separate inspection device, and using the measurement marks 53 defined around the subfields. From this data, the linear components of reticle deformation can be calculated by linear transformation of the mark coordinates using the matrix-conversion described above and a least-squares fit to determine, for each coordinate, the respective four matrix elements including elements corresponding to rotational error, orthogonality error, and magnification error.

There are two desirable ways in which to calculate non-linear components of deformation measured in the microlithography apparatus. One way is to convert non-linear components of data (measured outside the microlithography apparatus) subfield-by-subfield using corresponding linear corrections calculated using measurements performed inside the microlithography apparatus. The other way is to use non-linear components of subfield-distortion data measured outside the microlithography apparatus as non-linear components of subfield-deformation data measured inside the microlithography apparatus. The first way noted above takes into consideration effects of thermal expansion of the reticle in the microlithography apparatus.

As the reticle is exposed, each set of the four correction-matrix elements for each subfield coordinate is transformed into corresponding rotational error, orthogonality error, and magnification error, which are corrected in real time by the projection optics in the microlithography apparatus.

The deformation data obtained from the calculations described above can be entered into the subfield-position-coordinate table 86 (FIG. 1) in a memory of the controller 131 of the microlithography apparatus (step S35).

Figure 9:
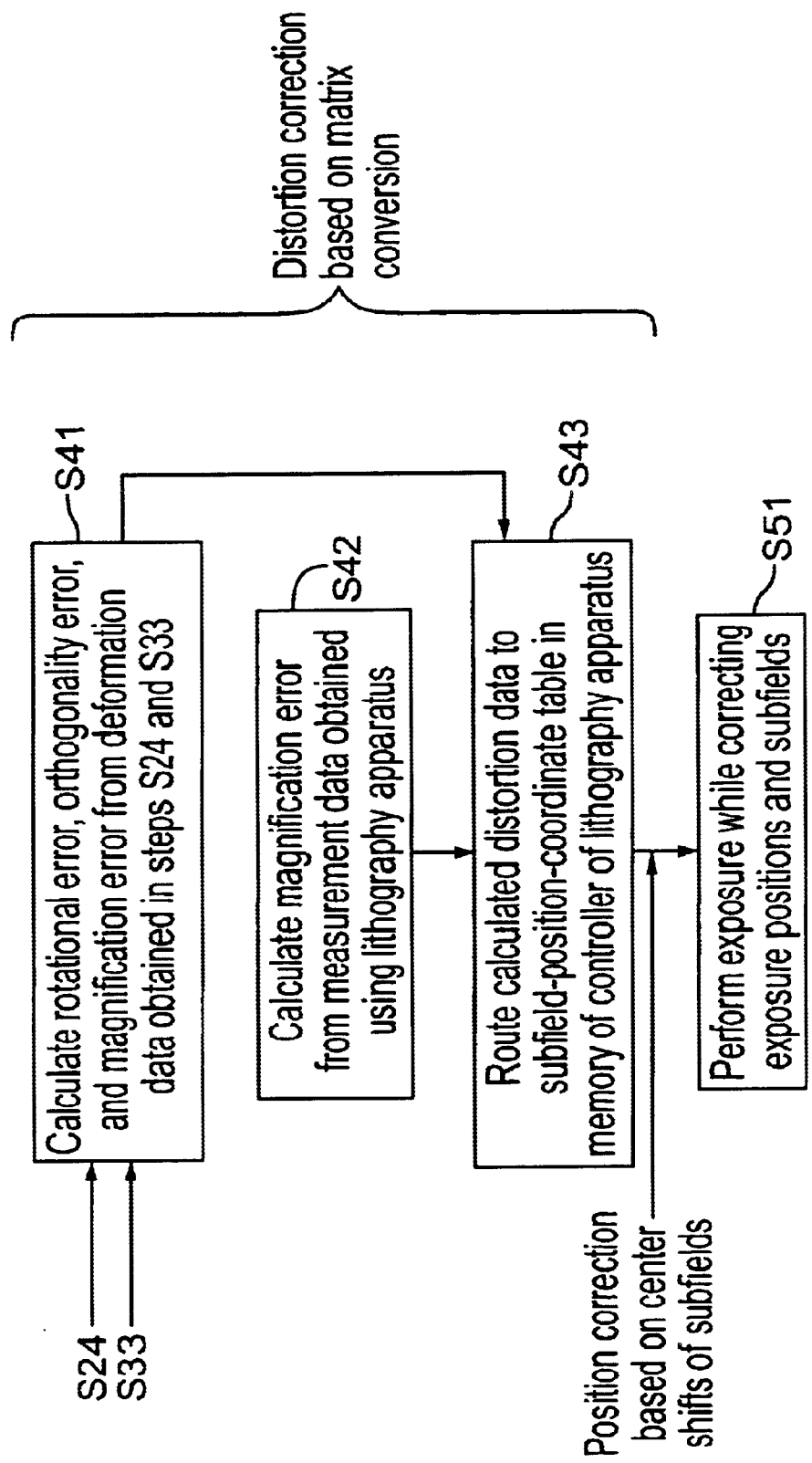
FIG. 9 is a flow chart of a representative embodiment of a method for correcting the linear components of deformation within subfields of the reticle.

Correction of linear distortions of the subfields is diagrammed in FIG. 9. Linear distortions of the subfields are calculated from the coordinate-measurement results obtained for the measurement marks 53 in peripheral subfields of the stripe. The main cause of linear distortions of the subfields is error in the reticle-drawing device. As a result, rotational error and orthogonality error of the respective pattern portions are different for each subfield. Magnification error also can arise; but, if present, magnification error usually is the same for each subfield. As described above, effects of the thermal environment of the reticle are manifest largely as magnification error. Hence, higher-accuracy correction may be expected by using magnification-error-correction data produced from subfield-coordinate-measurement data obtained inside the microlithography apparatus.

In view of the above, for determining linear distortion of subfields, respective rotational and orthogonality errors can be calculated from subfield-coordinate-measurement data (deformation data 1) obtained using the separate inspection device (step S41). Magnification error, on the other hand, may be calculated from subfield-coordinate measurement data (deformation data 2) obtained using the microlithography apparatus (step S42). High-accuracy corrections of reticle deformation can be achieved by determining respective exposure corrections for each subfield from these calculated errors, and exposing each subfield while making the respective corrections on the fly.

The reticle-deformation data obtained by the calculations described above are routed to the subfield-position-coordinate table 86 (FIG. 1) in a memory of the controller 131 of the microlithography apparatus (step S43).

Finally, lithographic exposures of the subfields are performed (step S51) while correcting the subfield-exposure positions on the fly using a deflector, rotational-correction lens, magnification-correction lens, etc., as required. The corrections are made by referring, for each subfield being exposed, to the respective data entered into the subfield-position-coordinate table in steps S35 and S43.

As described above, in cases in which measurements of the positions of the measurement marks 53 are performed using a separate reticle-inspection device, the cost of the reticle is increased with corresponding decreases in the throughput of the reticle-inspection device. The main causes of reticle deformation can be divided into factors involving the reticle-manufacturing process (e.g., resist stress, etc.) and factors involving the reticle-pattern-drawing device.

With respect to factors involving the reticle-manufacturing process, it is possible to obtain high reproducibility of the impact of the factors in each reticle by strictly controlling the reticle-manufacturing process. Accordingly, when detecting the respective positions of the measurement marks 53, it is not necessary to inspect actual reticles destined to be used for lithographic exposure. Rather, inspection data for any reticle that was manufactured by the same process may be used. Also, averaged data obtained from several reticles can be used. Hence, it is not necessary to inspect each and every reticle used for exposure, thereby avoiding unnecessary increases in the cost of the reticles.

Figure 10:
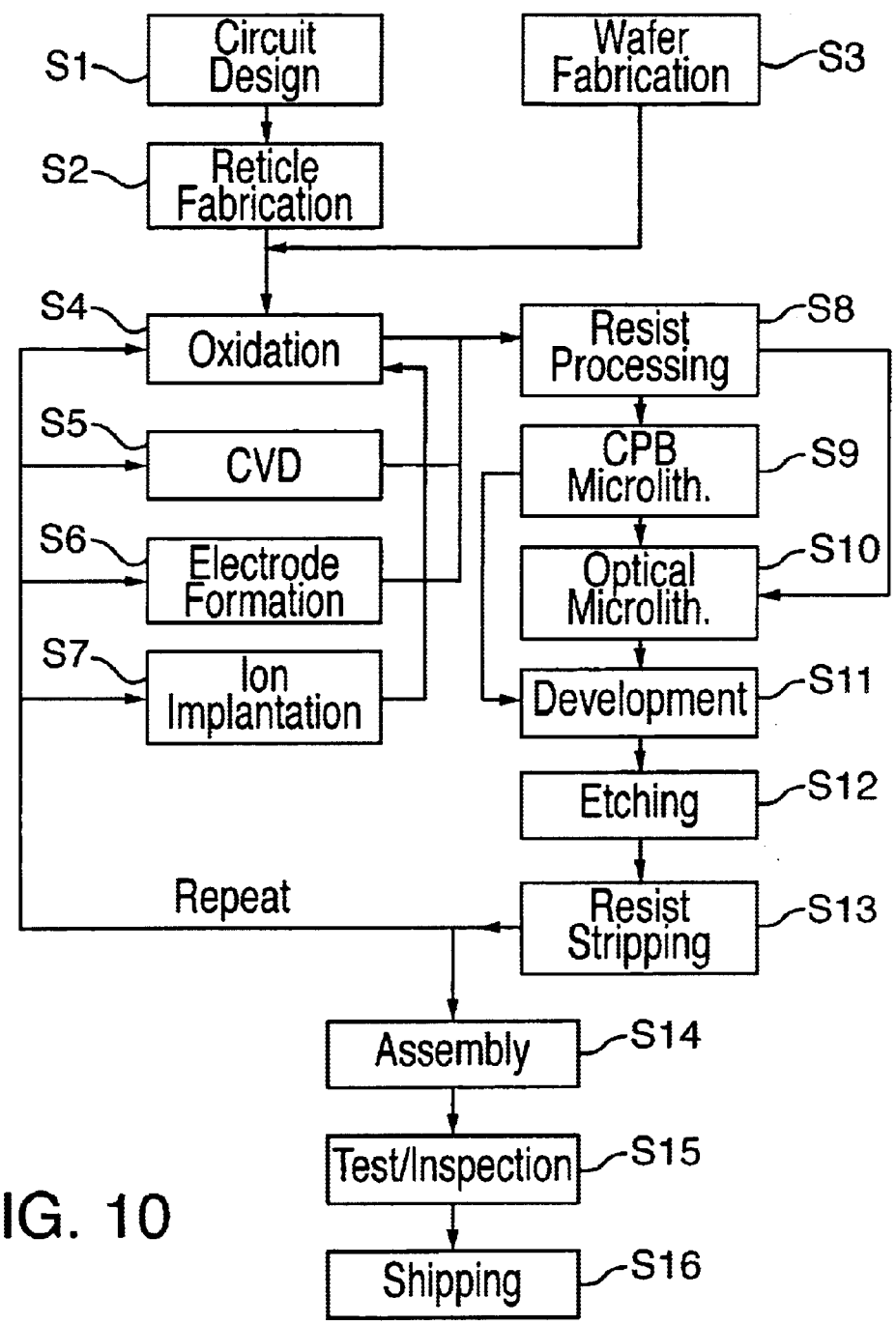
FIG. 10 is a flow chart of a representative method for manufacturing microelectronic devices such as integrated circuits (e.g., LSI chips, etc.), displays (e.g., liquid crystal panels), charged-coupled devices (CCDs), thin-film magnetic pickup heads, and micro-machines.

FIG. 10 is a flow chart of steps in a process for manufacturing a microelectronic device such as a semiconductor chip (e.g., an LSI device), a display panel (e.g., a liquid-crystal display panel), a charge-coupled device (CCD), a thin-film magnetic pickup head, or micromachine. In step S1, (circuit design) the circuit for the device is designed. In step S2 (reticle fabrication) a reticle or mask for the circuit is manufactured. Here, beam blurring caused by the proximity effect or by the space-charge effect may be corrected by locally resizing pattern elements as defined on the reticle. In step S3 (wafer fabrication) a wafer substrate is fabricated from a material such as silicon or other suitable material.

Steps 4–12 are directed to wafer-processing steps, specifically "pre-process" steps, in which the circuit pattern defined on the reticle is transferred onto the substrate. Step S4 (oxidation) is an oxidation step for oxidizing the surface of a substrate. In step S5 (CVD) an insulating film is formed on the substrate surface by chemical vapor deposition. In step S6 (electrode formation) electrodes are formed on the substrate, typically by vapor deposition. In step S7 (ion implantation) ions (e.g., dopant ions) are implanted into the substrate. In step S8 (resist processing) a layer of an exposure-sensitive agent ("resist") is applied to the surface of the substrate. Step S9 (CPB microlithography) involves lithographically exposing the pattern from the reticle (formed in step S2) to the resist so as to imprint the resist with the reticle pattern, as described elsewhere herein. Step S10 (optical microlithography) is an optional step in which an optical microlithography reticle made in step S2 is used for exposing an image of the reticle pattern on the resist by means of an optical "stepper." Before or after this step, exposure may be performed in a manner serving to correct proximity effects, wherein the effects of backscattered charged particles of the beam in the resist are made substantially uniform. In step S11 (development) the exposed resist is developed on the substrate. In step S12 (etching) the substrate is subjected to a suitable etching condition that selectively removes portions of the substrate surface not protected by the developed resist. Step S13 (resist stripping) involves removing remaining resist from the substrate after the etching step. By repeating steps S4–S13 as required, circuit patterns as defined by successive reticles are superposedly formed on the substrate.

Step S14 (assembly) is a "post-process" step, in which the substrate that has passed through steps S4–S13 is formed into chips. This step can include, e.g., assembling the devices (dicing and bonding) and packaging (encapsulation of individual chips), and other such steps. In step S15 (test/inspection) any of various operability, qualification, and durability tests and inspections of the devices produced in step S14 are conducted. Devices that successfully pass step S15 are finished, packaged, and shipped (step S16).

Whereas the invention has been described in connection with several representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. In a microlithography method, performed using a microlithography apparatus, in which a device pattern to be transferred onto a sensitive substrate is defined on a reticle divided into multiple subfields each defining a respective portion of the pattern, the reticle is illuminated subfield-by-subfield with an illumination beam to produce a corresponding patterned beam carrying an aerial image of the illuminated region of the reticle, the aerial image carried by the patterned beam is projected and focused as a subfield image at a respective location on the sensitive substrate, and the subfield images on the substrate are stitched together to form the device pattern on the substrate, a method for correcting deformation of the reticle, comprising:
    defining multiple position-measurement marks on the reticle;
    using a reticle-inspection device separate from the microlithography apparatus, detecting respective positional coordinates of at least some of the position-measurement marks on the reticle so as to produce a first set of reticle-deformation data;
    mounting the reticle in the microlithography apparatus and detecting respective positional coordinates of at least some of the position-measurement marks on the reticle so as to produce a second set of reticle-deformation data; and
    while performing exposure of the pattern from the reticle to the substrate, correcting one or more of the position and distortion of each subfield according to both the first and second sets of reticle-deformation data.

2. The method of claim 1, wherein the first set of reticle-deformation data is obtained by detecting respective positional coordinates of position-measurement marks located in regions of the reticle outside the subfields.

3. The method of claim 1, wherein the second set of reticle-deformation data is obtained by detecting respective positional coordinates of position-measurement marks located in regions of the reticle surrounding one or more stripes of the reticle.

4. The method of claim 3, wherein the position-measurement marks are located in subfields surrounding a pattern-defining stripe of the reticle.

5. The method of claim 1, wherein exposure of the pattern is performed using a charged-particle illumination beam and a charged-particle patterned beam.

6. The method of claim 1, wherein:
    the first set of reticle-deformation data comprises a respective linear component and a respective non-linear component;
    the second set of reticle-deformation data comprises a respective linear component and a respective non-linear component; and
    one or more of the position and distortion of each subfield is corrected according to the non-linear component of the first set of reticle-deformation data and the linear component of the second set of reticle-deformation data.

7. The method of claim 6, further comprising the steps of:
    for each of multiple subfields, calculating data regarding a respective rotational error and data regarding a respective orthogonality error from the first set of reticle-deformation data;
    for each of multiple subfields, calculating data regarding a respective magnification error from the second set of reticle-deformation data; and
    while performing exposure, one or more of the position and distortion of one or more subfields is corrected according to at least some of the respective calculated rotational error, orthogonality error, and magnification error.

8. The method of claim 1, further comprising the steps of:
    for each of multiple subfields, calculating data regarding a respective rotational error and data regarding a respective orthogonality error from the first set of reticle-deformation data;
    for each of multiple subfields, calculating data regarding a respective magnification error from the second set of reticle-deformation data; and
    while performing exposure, one or more of the position and distortion of one or more subfields is corrected according to at least some of the respective calculated rotational error, orthogonality error, and magnification error.

9. The method of claim 1, wherein:
    multiple reticles are produced using an identical manufacturing process for all the reticles;
    the first and second sets of reticle-deformation data are obtained from one of the multiple reticles; and
    the first and second sets of reticle-deformation data are used to correct, when using another of the multiple reticles for making a lithographic exposure, one or more of the position and distortion of subfields of the other reticle.

10. In a microlithography method, performed using a microlithography apparatus, in which a pattern defined by a reticle segmented into subfields each defining a respective portion of the pattern, a method for correcting deformation of the reticle, comprising:
    defining first and second sets of position-measurement marks on the reticle;
    obtaining respective coordinates of the first set of position-measurement marks to provide a first set of deformation data;
    from the first set of deformation data, calculating linear-correction parameters of the first set of deformation data;

obtaining respective linear components of the first set of deformation data;

calculating respective non-linear components of the first set of deformation data;

measuring respective coordinates of the second set of position-measurement marks to provide a second set of deformation data;

from the second set of deformation data calculating linear-correction parameters of the second set of deformation data;

obtaining respective linear components of the second set of deformation data;

obtaining respective subfield-position-coordinate data for the second set of deformation data;

entering the subfield-position-coordinate data of second set of deformation data into a subfield-position-coordinate table;

calculating linear distortion of the subfields of the reticle from respective subfield-coordinate-measurement data obtained from the first set of measurement marks;

calculating non-linear distortion of the subfields of the reticle from respective subfield-coordinate-measurement data obtained from the second set of measurement marks;

entering the calculated linear and non-linear distortion data into the subfield-position-coordinate table; and performing exposure of the subfields of the reticle based on corresponding recalled data from the subfield-position-coordinate table.

11. The method of claim 10, wherein the positional-measurement marks of the first set are located on support struts, and the positional-measurement marks of the second set are located in peripheral subfields.

12. The method of claim 10, wherein the respective coordinates of the first set of position-measurement marks are measured using a separate coordinate-measuring device.

13. The method of claim 10, wherein the linear-correction parameters of the first set of deformation data are calculated by substituting the first set of deformation data into a matrix-conversion model and performing a least squares fit.

14. The method of claim 13, wherein the matrix-conversion model is a matrix equation in which rotational error ($\theta$), orthogonality error ($\omega$), magnification errors ($S_x$ and $S_y$), and shifts ($O_x$ and $O_y$) of respective center-position coordinates of the subfields are respective variables.

15. The method of claim 10, wherein the linear components of the first set of deformation data are obtained by substituting corresponding design-mandated data into a matrix-conversion model into which respective linear-correction parameters of the first set of deformation data have been substituted.

16. The method of claim 10, wherein the non-linear components of the first set of deformation data are calculated by subtracting respective linear components from the first set of deformation data.

17. The method of claim 10, wherein the respective coordinates of the second set of position-measurement marks are measured using a microlithography apparatus with which the reticle is to be used for making a microlithographic exposure.

18. The method of claim 17, wherein the respective coordinates of the second set of position-measurement marks are measured using a through-the-reticle detection system of the microlithography apparatus.

19. The method of claim 10, wherein the linear-correction parameters of the second set of deformation data are calculated by substituting the second set of deformation data into a matrix-conversion model and performing a least squares fit.

20. The method of claim 19, wherein the matrix-conversion model is a matrix equation in which rotational error ($\theta$), orthogonality error ($\omega$), magnification errors ($S_x$ and $S_y$), and shifts ($O_x$ and $O_y$) of respective center-position coordinates of the subfields are respective variables.

21. The method of claim 10, wherein the linear components of the second set of deformation data are obtained by substituting corresponding design-mandated data into a matrix-conversion model into which respective linear-correction parameters of the second set of deformation data have been substituted.

22. The method of claim 10, wherein the subfield-position-coordinate data for the second set of deformation data are obtained by substituting respective non-linear components of the first set of deformation data into a matrix-conversion model into which respective linear-correction parameters of the second set of deformation data have been substituted.

23. The method of claim 10, wherein the non-linear components of the first set of deformation data and the subfield-position-coordinate data of second set of deformation data are entered into a subfield-position-coordinate table in a memory of a controller of a microlithography apparatus with which the reticle is to be used for making a lithographic exposure.

24. The method of claim 10, wherein the linear distortion of subfields of the reticle, as calculated from subfield-coordinate-measurement data obtained from the first set of measurement marks, includes rotational error and orthogonality error of the subfields.

25. The method of claim 10, wherein the non-linear distortion of subfields of the reticle, as calculated from subfield-coordinate-measurement data obtained from the second set of measurement marks, includes magnification error of the subfields.

26. The method of claim 10, wherein the calculated linear-distortion data and non-linear-distortion data are entered into a subfield-position-coordinate table in a memory in a controller of a microlithography apparatus with which the reticle is to be used for making a lithographic exposure.

27. A microlithography apparatus, comprising:

a reticle stage on which a reticle is mounted for making a lithographic exposure of a pattern, defined on the reticle, from the reticle to a sensitive substrate, the reticle being segmented into multiple subfields each defining a respective portion of the pattern;

an illumination-optical system situated upstream of the reticle stage and configured for illuminating each of the subfields on the reticle with an illumination beam;

a projection-optical system situated downstream of the reticle stage and configured for projecting and focusing a patterned beam, formed by passage of the illumination beam through or from an illuminated subfield of the reticle, at a selected location on a surface of the sensitive substrate;

a substrate stage situated downstream of the projection-optical system and configured for holding the sensitive substrate while a lithographic exposure is being made;

means for detecting deformation of the reticle mounted to the reticle stage; and a controller connected to and configured for controlling operation of the reticle stage, the illumination-optical system, the projection-optical system, the substrate stage, and said means for detecting reticle deformation, so as to achieve lithographic transfer of the pattern from the subfields of the reticle to corresponding locations on the sensitive substrate, the controller comprising a first memory configured for storing a first set of reticle-deformation data detected using a reticle-inspection device separate from the microlithography apparatus, a second memory configured for storing a second set of reticle-deformation data detected by the microlithography apparatus after the reticle has been mounted in the microlithography apparatus, and a correction calculator configured for calculating a position and/or deformation of each of multiple subfields as required from the first and second sets of reticle-deformation data recalled from the first and second memories, respectively, and for calculating respective corrections to be applied as the subfields are being lithographically exposed.

28. The apparatus of claim 27, wherein the correction calculator further comprises an exposure-position calculator configured to recall data from the first and second memories, and to calculate, based on the recalled data, respective corrections of exposure position required at various locations on the reticle.

29. The apparatus of claim 28, wherein the correction calculator further comprises a third memory for storing a subfield-coordinate-position table in which data produced by the exposure-position calculator are stored.

30. The apparatus of claim 29, wherein the correction calculator further comprises a command generator configured to recall data from the subfield-coordinate-position table and issue appropriate control commands to at least the projection-optical system based on the recalled data.

31. A microlithography method, comprising the reticle-deformation-correction method recited in claim 1.

32. A method for making a microelectronic device, comprising a microlithography method as recited in claim 31.

33. A microlithography method, comprising the reticle-deformation-correction method recited in claim 10.

34. A method for making a microelectronic device, comprising a microlithography method as recited in claim 33.

35. A microlithography method, performed using a microlithography apparatus as recited in claim 27.

36. A method for making a microelectronic device, comprising a microlithography method as recited in claim 35.

* * * * *